United States Patent
Egami et al.

(10) Patent No.: US 10,750,641 B2
(45) Date of Patent: Aug. 18, 2020

(54) PHASED ARRAY ANTENNA

(71) Applicant: Mitsubishi Electric Corporation, Chiyoda-ku (JP)

(72) Inventors: Soma Egami, Tokyo (JP); Hiroaki Matsuoka, Tokyo (JP); Yukari Saito, Tokyo (JP)

(73) Assignee: Mitsubishi Electric Corporation, Chiyoda-ku (JP)

( * ) Notice: Subject to any disclaimer, the term of this patent is extended or adjusted under 35 U.S.C. 154(b) by 0 days.

(21) Appl. No.: 15/768,743

(22) PCT Filed: Dec. 16, 2016

(86) PCT No.: PCT/JP2016/087516
§ 371 (c)(1),
(2) Date: Apr. 16, 2018

(87) PCT Pub. No.: WO2017/104790
PCT Pub. Date: Jun. 22, 2017

(65) Prior Publication Data
US 2018/0310436 A1    Oct. 25, 2018

(30) Foreign Application Priority Data

Dec. 17, 2015  (JP) ................................ 2016-246218
Feb. 25, 2016  (JP) ................................ 2016-034884

(51) Int. Cl.
*H05K 7/20*       (2006.01)
*H01Q 21/00*    (2006.01)
(Continued)

(52) U.S. Cl.
CPC .......... *H05K 7/20509* (2013.01); *F28F 3/06* (2013.01); *F28F 3/12* (2013.01); *F28F 13/08* (2013.01);
(Continued)

(58) Field of Classification Search
CPC ........ H05K 7/20509; H05K 7/20; H01Q 1/02; H01Q 3/26; H01Q 21/0025; H01Q 21/0087; H01Q 23/00
See application file for complete search history.

(56) References Cited

U.S. PATENT DOCUMENTS 5,642,776 A  *  7/1997  Meyer, IV .......... F28D 15/0233
                                                                165/104.26
6,253,835 B1     7/2001  Chu et al.
(Continued)

FOREIGN PATENT DOCUMENTS

EP       0 286 069 A2      10/1988
EP       1 381 083 A2       1/2004
(Continued)

OTHER PUBLICATIONS

International Search Report dated Mar. 7, 2017 in PCT/JP2016/087516 filed Dec. 16, 2016.
(Continued)

*Primary Examiner* — Jayprakash N Gandhi
*Assistant Examiner* — Michael A Matey
(74) *Attorney, Agent, or Firm* — Oblon, McClelland, Maier & Neustadt, L.L.P.

(57) ABSTRACT

A phased array antenna in which a plurality of blocks each having a plurality of transmitter modules are arrayed, includes: a front plate that includes a plurality of flow paths of a refrigerant therein; and an element feeding layer that includes a plurality of antenna elements respectively connected to the transmitter modules and that is placed in close contact with one surface of the front plate. Each of the blocks includes a heat spreader that is placed in close contact with the other surface of the front plate. The transmitter modules are mounted on the heat spreader. Heat generated
(Continued)

in the transmitter modules is transferred to the refrigerant via the heat spreader and the front plate.

9 Claims, 9 Drawing Sheets

(51) Int. Cl.
    *H01Q 3/26*     (2006.01)
    *H01Q 23/00*     (2006.01)
    *H01Q 1/02*     (2006.01)
    *H01L 23/473*     (2006.01)
    *F28F 3/06*     (2006.01)
    *F28F 13/14*     (2006.01)
    *H01L 23/427*     (2006.01)
    *F28F 3/12*     (2006.01)
    *F28F 13/08*     (2006.01)
    *F28F 1/40*     (2006.01)
    *H01L 23/373*     (2006.01)
    *F28F 3/04*     (2006.01)
    *F28D 21/00*     (2006.01)

(52) U.S. Cl.
    CPC ............ *F28F 13/14* (2013.01); *H01L 23/427* (2013.01); *H01L 23/473* (2013.01); *H01Q 1/02* (2013.01); *H01Q 3/26* (2013.01); *H01Q 21/0025* (2013.01); *H01Q 21/0087* (2013.01); *H01Q 23/00* (2013.01); *H05K 7/20* (2013.01); *F28D 2021/0029* (2013.01); *F28F 1/40* (2013.01); *F28F 3/048* (2013.01); *H01L 23/373* (2013.01); *H01L 23/3736* (2013.01)

(56) References Cited

U.S. PATENT DOCUMENTS

| | | | |
|---|---|---|---|
| 6,469,671 | B1 | 10/2002 | Pluymers et al. |
| 6,876,323 | B2 * | 4/2005 | Feldle ................ H01Q 21/0025 342/157 |
| 7,508,338 | B2 | 3/2009 | Pluymers et al. |
| 2002/0131237 | A1 | 9/2002 | Snyder et al. |
| 2006/0090489 | A1 * | 5/2006 | Haws .................... H05K 5/0213 62/176.6 |
| 2008/0169973 | A1 | 7/2008 | Pluymers et al. |
| 2008/0303716 | A1 * | 12/2008 | Gallivan .................. H01Q 1/42 342/368 |
| 2009/0084527 | A1 | 4/2009 | Rummel et al. |
| 2011/0173813 | A1 * | 7/2011 | Tochon .................. B01J 19/249 29/890.03 |
| 2011/0303399 | A1 | 12/2011 | Sakimichi et al. |
| 2012/0033383 | A1 * | 2/2012 | Jones ....................... H01Q 1/02 361/701 |
| 2012/0068906 | A1 * | 3/2012 | Asher ................ H01Q 21/0025 343/853 |
| 2012/0218149 | A1 * | 8/2012 | Edward .............. H01Q 21/0025 342/368 |
| 2013/0321239 | A1 * | 12/2013 | Bingham ................. H01Q 1/24 343/879 |
| 2016/0113146 | A1 * | 4/2016 | Rowe ....................... H01Q 1/02 361/695 |
| 2016/0218412 | A1 * | 7/2016 | Day ......................... H01Q 1/02 |
| 2018/0219277 | A1 * | 8/2018 | Hirata .................... H04B 1/036 |

FOREIGN PATENT DOCUMENTS

| | | |
|---|---|---|
| JP | 10-200281 A | 7/1998 |
| JP | 2003-110330 A | 4/2003 |
| JP | 2006-245114 A | 9/2006 |
| JP | 2008-160022 A | 7/2008 |
| JP | 2009-159430 A | 7/2009 |
| JP | 2009-253140 A | 10/2009 |
| JP | 4844554 B2 | 12/2011 |
| JP | 2014-502003 A | 1/2014 |
| JP | 2014-239371 A | 12/2014 |

OTHER PUBLICATIONS

Office Action dated May 8, 2018 in Japanese Patent Application No. 2017-556459 with English translation, 5 pages.
Extended European Search Report dated Apr. 15, 2019 in European Patent Application No. 16875764.9, 16 pages.
Japanese Office Action dated May 28, 2019 in Japanese Patent Application No. 2018-128179 (with English translation), 7 pages.
Supplementary Partial European Search Report dated Nov. 13, 2018 in European Patent Application No. 16875764.9, 14 pages.

* cited by examiner

PHASED ARRAY ANTENNA

FIELD

The present invention relates to a phased array antenna having a plurality of arrayed antenna elements.

BACKGROUND

A general phased array antenna is configured to include an antenna element, a power-feed circuit, a transmitter module, and an antenna housing. The general phased array antenna also includes a cooling system that uses a liquid refrigerant and enables a semiconductor element mounted in an electronic component such as a transmitter module to stably operate at a specified temperature or lower.

In Patent Literature 1, an invention is described in which transmitter modules are mounted such that a plurality of the transmitter modules are mounted on a block and then a plurality of the blocks are attached in an array to a phased array antenna. In this configuration, the pipes of the respective blocks are connected to each other by using a member such as a hose to constitute a flow path. In order to increase the cooling performance, a cooling plate is placed near the transmitter modules to lower the thermal resistance between the transmitter modules and the refrigerant.

CITATION LIST

Patent Literature

Japanese Patent Application Laid-open No. 2009-253140

SUMMARY

Technical Problem

However, with the invention described in Patent Literature 1 above, because it is necessary to use piping parts such as a hose and a coupler in order to connect the pipes of the respective blocks to each other, there is a disadvantage in that the piping configuration is complicated. Consequently, the invention described in Patent Literature 1 has a problem in that the pressure loss along the flow path is high. It is also difficult for the invention described in Patent Literature 1 to achieve a large cost reduction and weight reduction of the cooling system because it is difficult to simplify the piping.

The present invention has been achieved in view of the above problems, and an objective of the present invention is to provide a phased array antenna with simplified piping for the flow path of the refrigerant.

Solution to Problem

In order to solve the above problems and achieve the object, an aspect of the present invention is a phased array antenna in which a plurality of blocks each having a plurality of transmitter modules are arrayed. The phased array antenna includes: a front plate including a plurality of flow paths of a refrigerant therein; and an element feeding layer including antenna elements respectively connected to the transmitter modules and being placed in close contact with one surface of the front plate. Each of the blocks includes a heat spreader that is placed in close contact with the other surface of the front plate, and the transmitter modules are mounted on the heat spreader. The present invention transfers heat generated in the transmitter modules to the refrigerant via the heat spreader and the front plate.

Advantageous Effects of Invention

According to the present invention, there is an effect that can simplify piping of a flow path of a refrigerant.

DESCRIPTION OF EMBODIMENTS

A phased array antenna according to embodiments of the present invention will be described below in detail with reference to the accompanying drawings. The present invention is not limited to the embodiments.

First Embodiment

Figure 1:
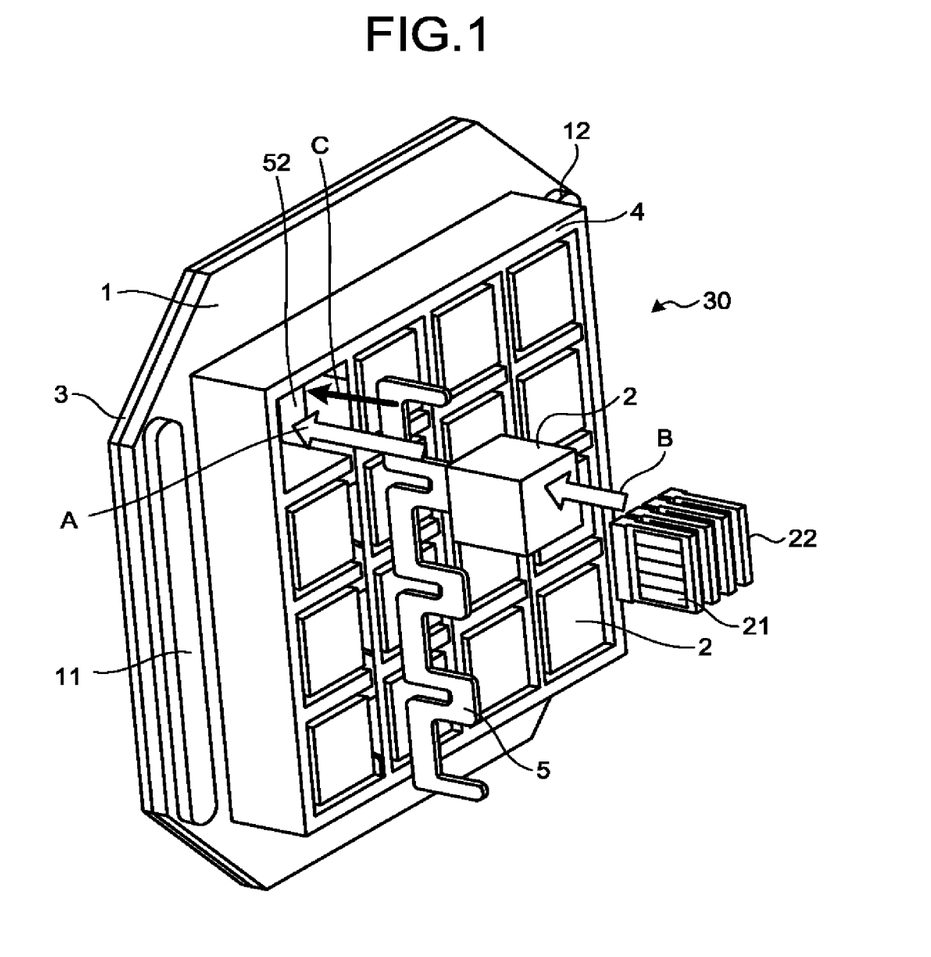
FIG. 1 is a diagram illustrating a configuration of a phased array antenna according to a first embodiment of the present invention.

FIG. 1 is a diagram illustrating a configuration of a phased array antenna according to a first embodiment of the present invention. In a phased array antenna 30 according to the first embodiment, a front plate 1, which is a cooling plate, has an element feeding layer 3 on its front surface. The element feeding layer 3 is a heat-generating element having a plurality of antenna elements. Blocks 2 are fixed within a frame 4 in the form of a lattice attached to a back surface of the front plate 1. The blocks 2 are inserted into the frame 4 in the block-insertion direction indicated by an arrow A.

Each of the blocks 2 includes a plurality of heat spreaders 22 arrayed therein. A plurality of transmitter modules 21 that are heat-generating elements are collectively mounted on each of the heat spreaders 22. The heat spreaders 22 are made of a material with a high thermal conductivity. The heat spreaders 22 are attached to the front plate 1 in the heat-spreader attaching direction indicated by an arrow B and are arrayed. It is sufficient that each of the transmitter modules 21 has at least a transmission function. The transmitter module 21 can be a transmitter/receiver module that has both a transmission function and a receiving function.

By inserting the blocks 2 into the frame 4, each of the transmitter modules 21 is individually connected to an antenna element, not illustrated, in the element feeding layer 3 via a through hole provided in the front plate 1, and thus the transmitter modules 21 can radiate an electromagnetic wave through the antenna element.

A power-supply wire 5, which is a heat-generating element, is fixed to the frame 4. The power-supply wire 5 is attached to the frame 4 in the direction indicated by an arrow C. The power-supply wire 5 is fixed along a side surface in the lattice, such as a power-supply-wire fixing surface 52.

The blocks 2, the element feeding layer 3, and the power-supply wire 5 are in close contact with the front plate 1 or the frame 4 via a thermal sheet 6 described later, grease, or adhesive.

A manifold 11 is provided on the left side of the back surface of the front plate 1. A manifold 12 is provided on the right side of the back surface of the front plate 1. A refrigerant supplied from an external cooling device flows through the front plate 1 via the manifolds 11 and 12. Note that it is not necessary that the manifolds 11 and 12 are fixed to the front plate 1. The manifolds 11 and 12 can be provided away from the front plate 1 and be connected to the front plate 1 with tubes. That is, it is also possible to employ a configuration in which the manifolds 11 and 12 are omitted and the refrigerant is enabled to enter to and exit from the front plate 1 directly. An example of the refrigerant is an ethylene glycol solution. However, the refrigerant is not limited thereto.

As described above, the phased array antenna 30 according to the first embodiment includes the plural blocks 2 arrayed therein. Each block 2 includes the plural transmitter modules 21. The phased array antenna 30 includes the front plate 1, which has a plurality of flow paths of the refrigerant therein, and the element feeding layer 3, which is placed in close contact with one surface of the front plate 1. The element feeding layer 3 has a plurality of antenna elements connected to the transmitter modules 21. Each of the blocks 2 includes the heat spreaders 22 placed in close contact with the other surface of the front plate 1. The transmitter modules 21 are mounted on each of the heat spreaders 22. The phased array antenna 30 also includes the power-supply wire 5, which supplies power to the blocks 2, and the frame 4, which is placed in close contact with the other surface of the front plate 1 and separates the blocks 2 from each other. The power-supply wire 5 is placed in close contact with the frame 4.

Figure 2:
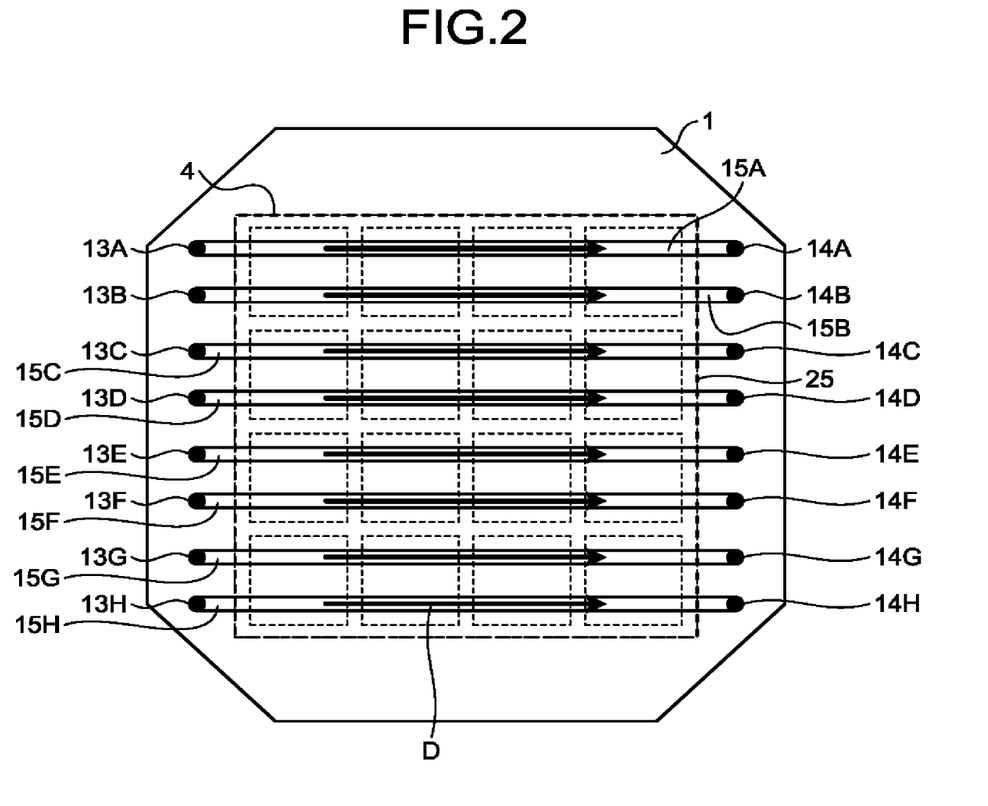
FIG. 2 is a diagram illustrating an internal configuration of a front plate of the phased array antenna according to the first embodiment.

FIG. 2 is a diagram illustrating an internal configuration of the front plate of the phased array antenna according to the first embodiment. In FIG. 2, the front plate 1 is shown and a position at which the frame 4 is placed is indicated by a broken line. The front plate 1 is formed from an aluminum material. A plurality of flow paths 15A, 15B, 15C, 15D, 15E, 15F, 15G, and 15H are provided in the front plate 1. A refrigerant flowing into the flow paths 15A, 15B, 15C, 15D, 15E, 15F, 15G, and 15H from left refrigerant inlet/outlet ports 13A, 13B, 13C, 13D, 13E, 13F, 13G, and 13H passes through the flow paths 15A, 15B, 15C, 15D, 15E, 15F, 15G, and 15H, and exits from right refrigerant inlet/outlet ports 14A, 14B, 14C, 14D, 14E, 14F, 14G, and 14H, respectively, as indicated by arrows D. By providing flow paths in and around a block placement area 25 of the front plate 1, heat generated in the blocks 2, the element feeding layer 3, and the power-supply wire 5 is discharged to the refrigerant. Although illustrations thereof are omitted in FIG. 2, the through holes for connecting the respective transmitter modules 21 to the antenna elements in the element feeding layer 3 are provided at positions that do not correspond with the flow paths 15A, 15B, 15C, 15D, 15E, 15F, 15G, and 15H.

The front plate 1 can be formed by stacking a plurality of plates that each has holes formed at positions corresponding to the flow paths 15A, 15B, 15C, 15D, 15E, 15F, 15G, and 15H.

Figure 3:
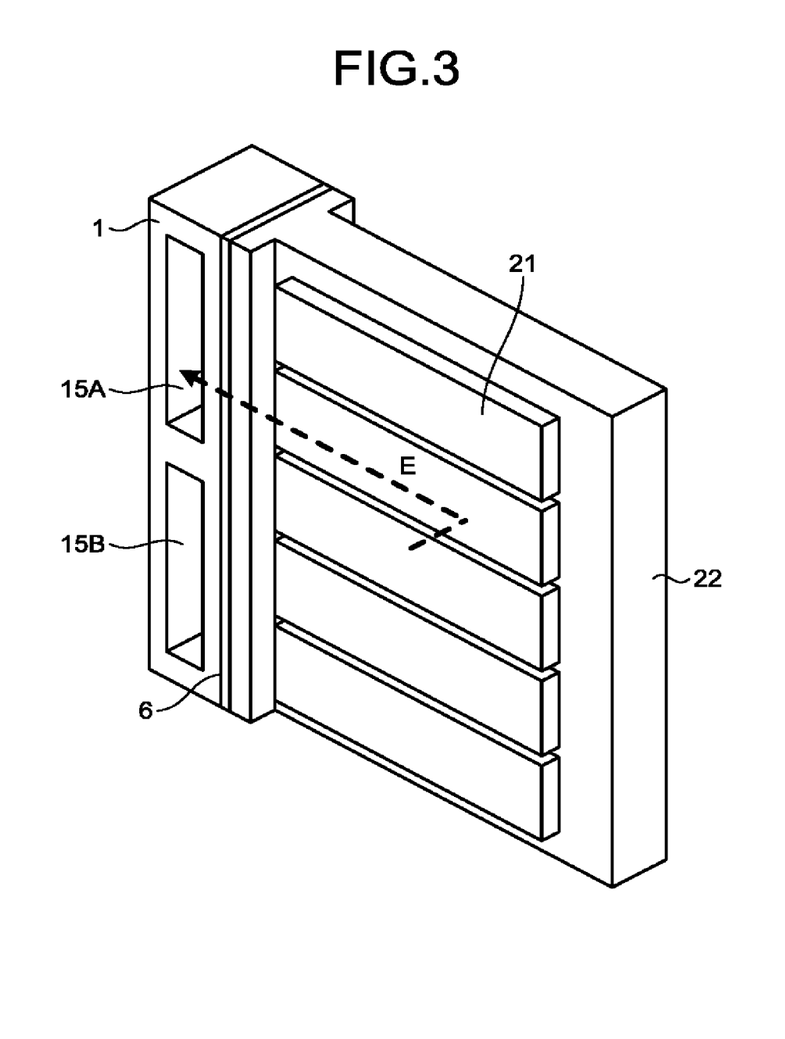
FIG. 3 is a diagram illustrating a heat-discharge path from a transmitter module to a refrigerant in the phased array antenna according to the first embodiment.

FIG. 3 is a diagram illustrating a heat-discharge path from a transmitter module to a refrigerant in the phased array antenna according to the first embodiment. Only a portion of the front plate 1 is illustrated in FIG. 3. An end surface of the heat spreader 22 with the transmitter modules 21 fixed thereto is in contact with the front plate 1 via the thermal sheet 6. Further, as illustrated in FIG. 2, the flow paths 15A and 15B are provided in the front plate 1 at a position where the blocks 2 are placed. Heat generated in the transmitter modules 21 is conducted to the front plate 1 via the heat spreader 22 and the thermal sheet 6, and it is transferred by the refrigerant flowing along the flow paths 15A and 15B, as illustrated in the heat-discharge path indicated by an arrow E.

Although FIG. 3 illustrates a portion of the front plate 1 in which the flow paths 15A and 15B are provided, the heat-transfer paths in the portions in which the flow paths 15C, 15D, 15E, 15F, 15G, and 15H are provided are identical to the heat-transfer path in the portion in which the flow paths 15A and 15B are provided.

By mounting an electronic component, which serves as a heat source in each of the transmitter modules 21, on a substrate at a position close to the front plate 1, it is possible to reduce the heat transfer distance.

In the manner described above, the heat generated in the transmitter modules 21 is conducted to the refrigerant, and thus the transmitter modules 21 are cooled.

Similarly, heat generated in the element feeding layer 3 is also conducted to the front plate 1 via a contact surface, and it is transferred by the refrigerant. Heat generated in the power-supply wire 5 is conducted to the front plate 1 via the frame 4 and is transferred by the refrigerant.

The phased array antenna 30 according to the first embodiment can indirectly cool the transmitter modules 21 while retaining cooling capacity for the transmitter modules 21. Pipe joints are attached to the manifolds 11 and 12, and they do not need to be provided in the respective blocks 2. Therefore, piping can be simplified. Further, it is possible to reduce the risk of a failure caused by the refrigerant adhering to the transmitter module 21 during maintenance; therefore, reliability can be improved. Further, it is possible to cool the element feeding layer 3 and the power-supply wire 5 without a cooling device being provided which is different from the cooling device for cooling the block 2.

Second Embodiment

Figure 4:
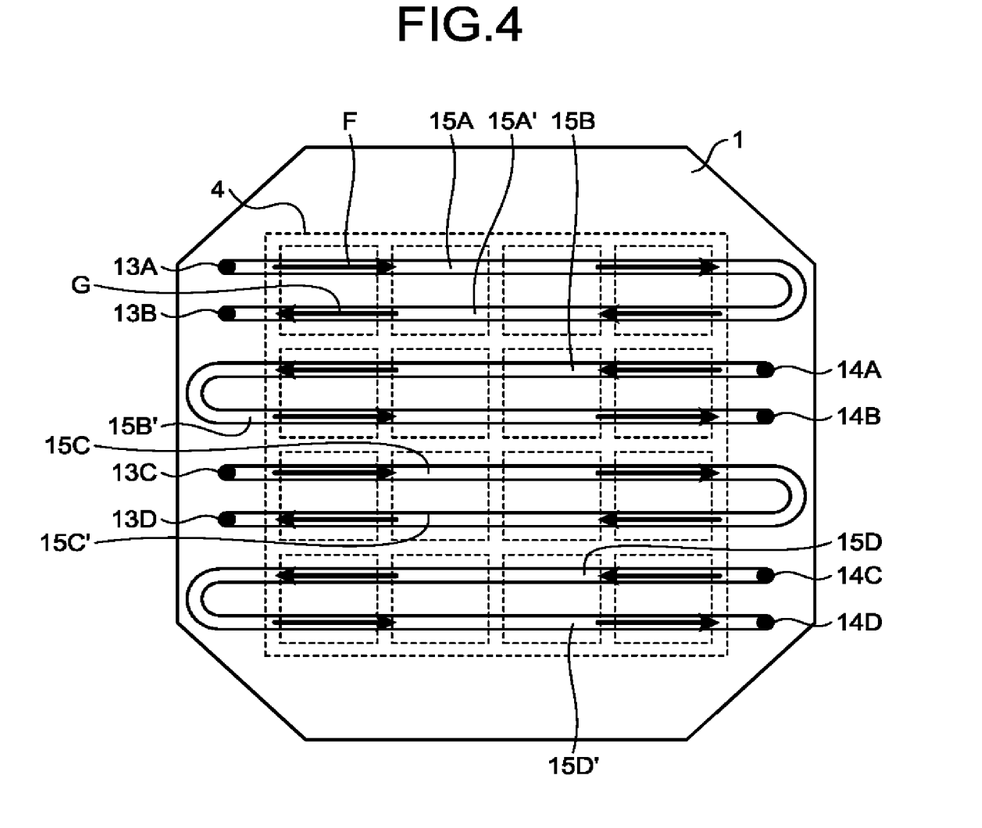
FIG. 4 is a diagram illustrating a configuration of flow paths in a front plate of a phased array antenna according to a second embodiment of the present invention.

FIG. 4 is a diagram illustrating a configuration of flow paths in a front plate of a phased array antenna according to a second embodiment of the present invention. In FIG. 4, the front plate 1 is shown and a position at which the frame 4 is placed is indicated by a broken line. In the front plate 1 of the phased array antenna according to the second embodiment, the flow path 15A includes the left refrigerant inlet/outlet port 13A as an inlet port and the left refrigerant inlet/outlet port 13B as an outlet port. The flow path 15B includes the right refrigerant inlet/outlet port 14A as an inlet port and the right refrigerant inlet/outlet port 14B as an outlet port. Further, the flow path 15C includes the left refrigerant inlet/outlet port 13C as an inlet port and the left refrigerant inlet/outlet port 13D as an outlet port. The flow path 15D includes the right refrigerant inlet/outlet port 14C as an inlet port and the right refrigerant inlet/outlet port 14D as an outlet port. Other configurations of the second embodiment are identical to those of the first embodiment.

In the first embodiment, the refrigerant flowing into the flow paths 15A, 15B, 15C, 15D, 15E, 15F, 15G, and 15H from the left refrigerant inlet/outlet ports 13A, 13B, 13C, 13D, 13E, 13F, 13G, and 13H exits from the right refrigerant inlet/outlet ports 14A, 14B, 14C, 14D, 14E, 14F, 14G, and 14H. The temperature of the refrigerant is lower at the more upstream positions in each of the flow paths 15A, 15B, 15C, 15D, 15E, 15F, 15G, and 15H, and rises due to the absorbing of heat from the transmitter modules 21 as the refrigerant flows downstream.

In contrast, in the second embodiment, the refrigerant flowing into the flow path 15A from the left refrigerant inlet/outlet port 13A passes through the flow path 15A and reaches the right end of the front plate 1 as indicated by an arrow F, and thereafter passes through a flow path 15A', which is folded back and reaches the left refrigerant inlet/outlet port 13B as indicated by an arrow G. Finally, the refrigerant flows out from the left refrigerant inlet/outlet port 13B. The refrigerant flowing into the flow path 15B from the right refrigerant inlet/outlet port 14A passes through the flow path 15B and reaches the left end of the front plate 1, thereafter passes through a folded-back flow path 15B' and reaches the right refrigerant inlet/outlet port 14B, and then flows out from the right refrigerant inlet/outlet port 14B. The refrigerant flowing into the flow path 15C from the left refrigerant inlet/outlet port 13C passes through the flow path 15C and reaches the right end of the front plate 1, thereafter passes through a folded-back flow path 15C' and reaches the left refrigerant inlet/outlet port 13D, and then flows out from the right refrigerant inlet/outlet port 13D. The refrigerant flowing into the flow path 15D from the right refrigerant inlet/outlet port 14C passes through the flow path 15D and reaches the left end of the front plate 1, thereafter passes through a folded-back flow path 15D' and reaches the right refrigerant inlet/outlet port 14D, and then flows out from the right refrigerant inlet/outlet port 14D.

At this time, there is a difference in the refrigerant temperature in a portion where the flow path 15A and the flow path 15A' are adjacent to each other. The difference in the refrigerant temperature is greatest in a portion where the left refrigerant inlet/outlet port 13A and the left refrigerant inlet/outlet port 13B are adjacent to each other. Similarly, the difference in the refrigerant temperature between the flow path 15C and the flow path 15C' is largest in a portion where the left refrigerant inlet/outlet port 13C and the left refrigerant inlet/outlet port 13D are adjacent to each other. Further, there is a difference in the refrigerant temperature in a portion where the flow path 15B and the flow path 15B' are adjacent to each other. The difference in the refrigerant temperature is largest in a portion where the right refrigerant inlet/outlet port 14A and the right refrigerant inlet/outlet port 14B are adjacent to each other. Similarly, the difference in the refrigerant temperature between the flow path 15D and the flow path 15D' is largest in a portion where the right refrigerant inlet/outlet port 14C and the right refrigerant inlet/outlet port 14D are adjacent to each other.

Heat generated in the transmitter modules 21 is transferred to the front plate 1, and thus the heat is conducted to both the refrigerant flowing in the flow path 15A and the refrigerant flowing in the flow path 15A'. In this case, with regard to heat movement in the heat spreaders 22 and in the front plate 1, more heat is conducted to the refrigerant in the flow path 15A, which is lower in temperature. In each of the flow path 15A and the flow path 15A', heat can be more easily conducted to the refrigerant at a more upstream position. The flowing directions in the flow path 15A and in the flow path 15A' are opposite to each other, and therefore the block 2 at the right end of the front plate 1, at which heat is least likely to be conducted to the refrigerant in the flow path 15A, is located at the most upstream position in the flow path 15A', at which heat is most likely to be conducted to the refrigerant. That is, the block 2 that is less likely to be cooled by the refrigerant in the flow path 15A can be more easily cooled by the refrigerant in the flow path 15A'. Therefore, temperature differences between modules at the right ends of the flow paths 15A and 15A' and modules at the left ends can be made closer than those in the prior techniques. In the same way, the temperature differences are closer for the flow paths 15B and 15B', 15C and 15C', and 15D and 15D'. Therefore, when compared with the phased array antenna 30 according to the first embodiment, in which the refrigerant flows in the flow paths 15A to 15H in the same direction, i.e., from left to right, it is possible to reduce the temperature rise in the transmitter modules 21 placed in the blocks 2, the power-supply wire 5, and the element feeding layer 3 in a right portion of the front plate 1.

Third Embodiment

Figure 5:
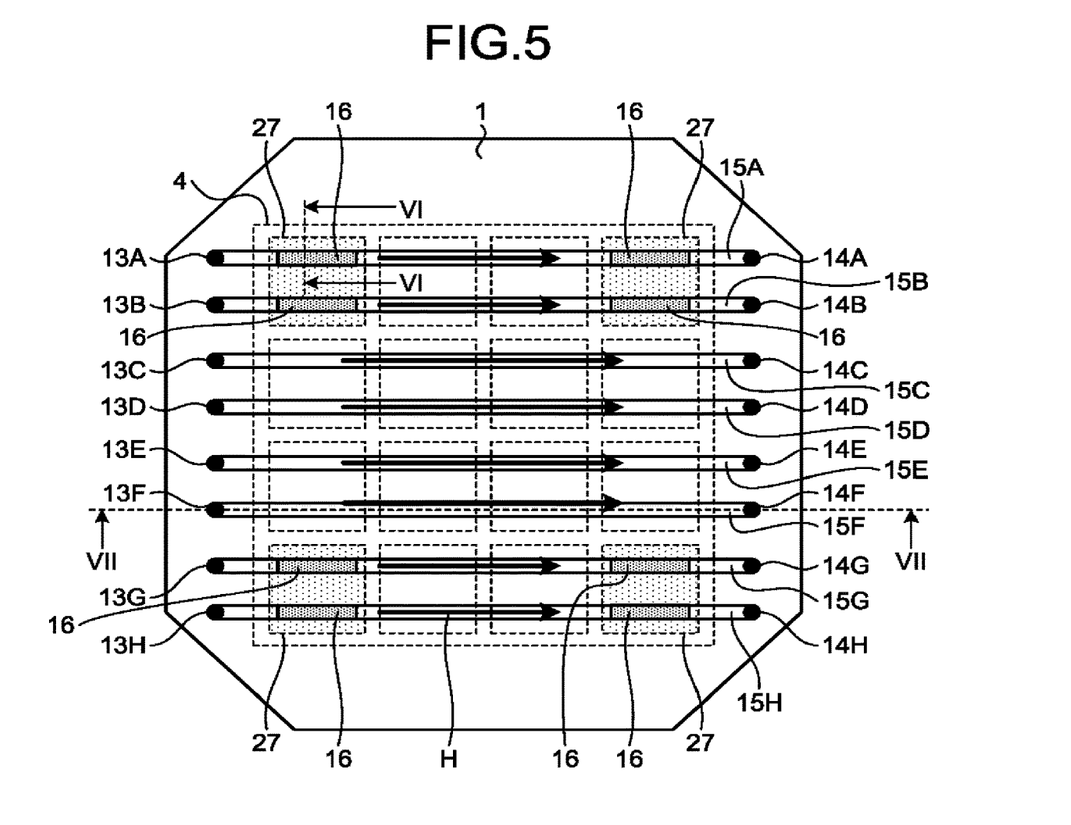
FIG. 5 is a diagram illustrating a configuration of flow paths in a front plate of a phased array antenna according to a third embodiment of the present invention.
Figure 6:
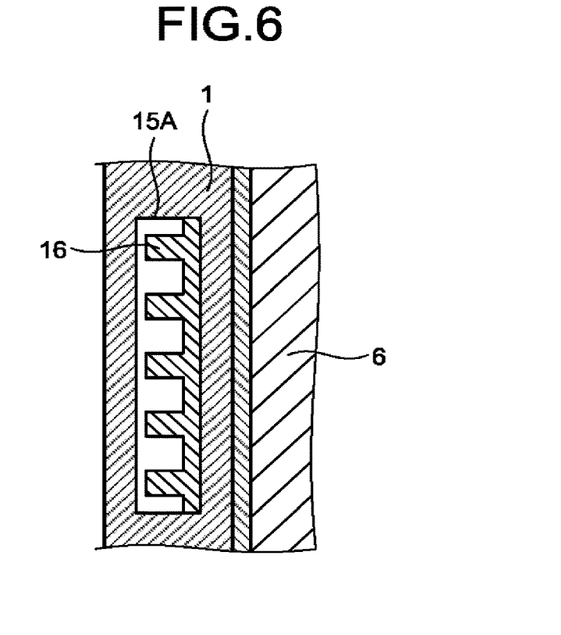
FIG. 6 is a cross-sectional view of the front plate of the phased array antenna according to the third embodiment.

FIG. 5 is a diagram illustrating a configuration of flow paths in the front plate of a phased array antenna according to a third embodiment of the present invention. FIG. 6 is a cross-sectional view of the front plate of the phased array antenna according to the third embodiment. FIG. 6 illustrates a cross-section taken along a line VI-VI in FIG. 5. In FIG. 5, the front plate 1 is shown and a position at which the frame 4 is placed is indicated by a broken line. In a high-heat-generating-element placement area 27 of the phased array antenna according to the third embodiment, a part that generates a higher amount of heat than components fixed to other areas is fixed to the front plate 1 in close contact therewith. In the third embodiment, the refrigerant flows, as in the first embodiment, from the left end to the right end of the front plate 1 as indicated by an arrow H in FIG. 5. In the front plate 1, cooling fins 16 are provided in portions in the flow paths 15A, 15B, 15G, and 15H, the portions corresponding to the high-heat-generating-element placement areas 27. As illustrated in FIG. 6, the cooling fin 16 has a shape made up of concave portions and convex portions and which increases the area of heat transfer in a flow path. Therefore, the cooling fin 16 can locally improve the convective heat transfer coefficient of the refrigerant and can reduce the temperature rise in a high heat-generating element. FIG. 5 illustrates a configuration in which a high heat-generating component, such as a power supply, is placed, instead of a block, in the high-heat-generating-element placement areas 27 located at four corners of the placement areas and arrayed in a matrix.

Figure 7:
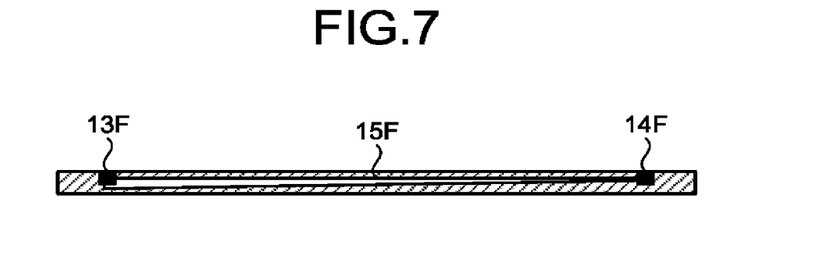
FIG. 7 is a cross-sectional view of the front plate of the phased array antenna according to the third embodiment.

FIG. 7 is a cross-sectional view of the front plate of the phased array antenna according to the third embodiment, taken along a line VII-VII in FIG. 5. As illustrated in FIG. 7, the width of the flow path 15F is narrower at a more downstream position. Similarly, the width of each of the flow paths 15A, 15B, 15C, 15D, 15E, 15G, and 15H is narrower at a more downstream position. Because the width of each of the flow paths 15A, 15B, 15C, 15D, 15E, 15F, 15G, and 15H is narrower at a more downstream position, the flow rate of the refrigerant increases and the convective heat transfer coefficient at the more downstream position is improved. Therefore, it is possible to reduce the temperature rise in a heat-generating element placed at a downstream position in each of the flow paths 15A, 15B, 15C, 15D, 15E, 15F, 15G, and 15H.

Other configurations of the third embodiment are identical to those of the first embodiment.

As described above, in the flow paths 15A, 15B, 15C, 15D, 15E, 15F, 15G, and 15H that are provided in the front plate 1, the cooling fin 16 is formed in the vicinity at a position with which a high heat-generating element is in close contact or the width of the flow path is made narrower at a more downstream position. With this configuration, it is possible to reduce the temperature rise in the heat-generating element.

Fourth Embodiment

Figure 8:
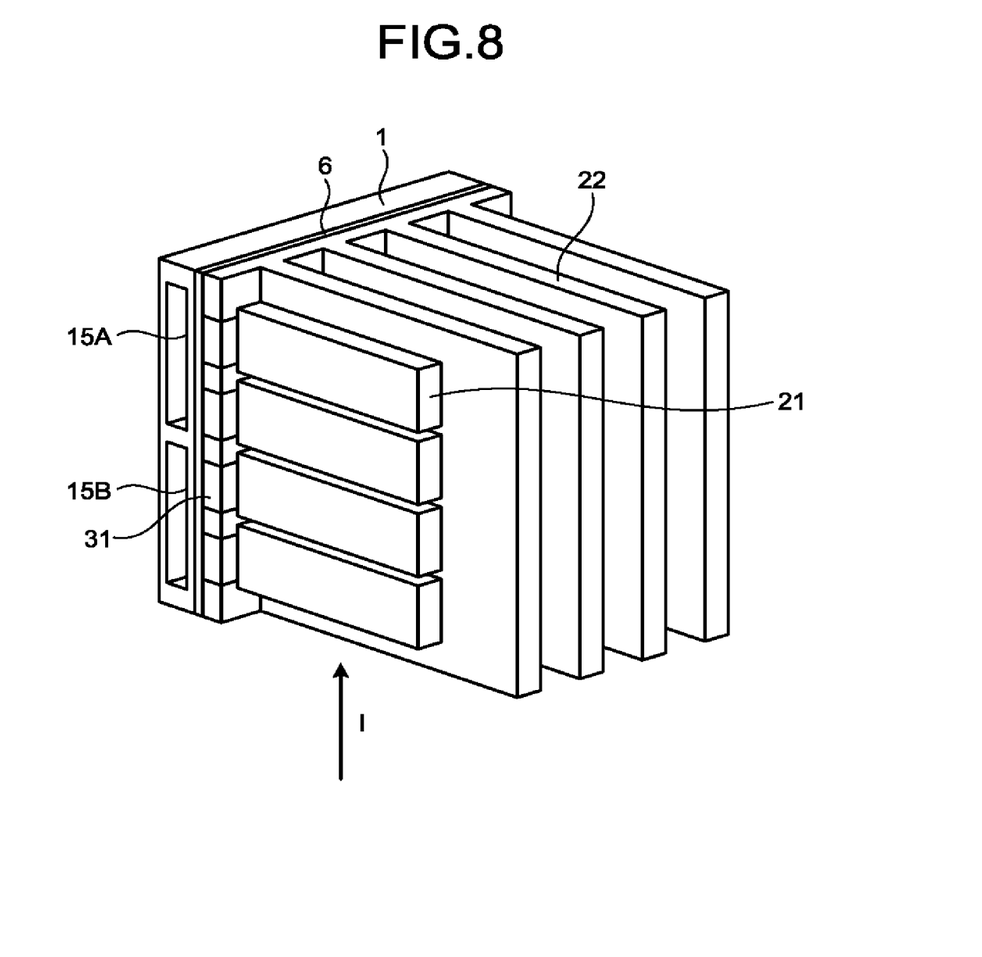
FIG. 8 is a diagram illustrating a heat-discharge path from a transmitter module to a refrigerant in a phased array antenna according to a fourth embodiment.
Figure 9:
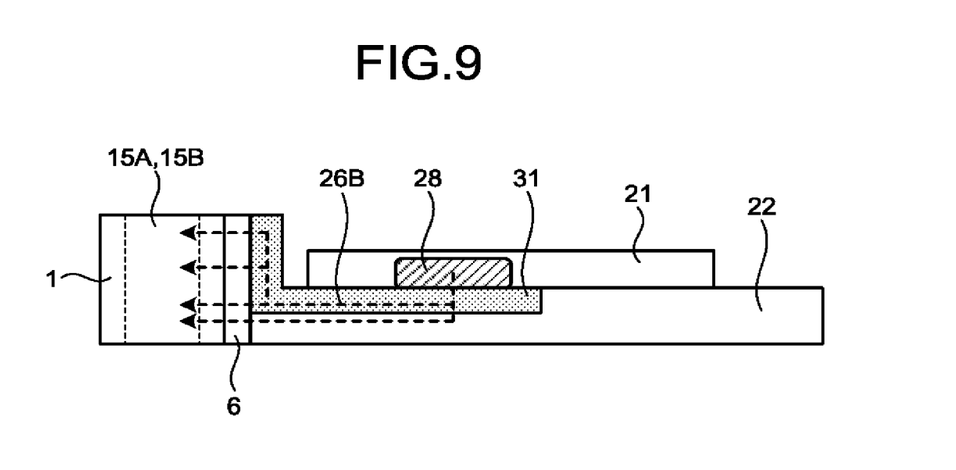
FIG. 9 is a diagram illustrating the heat-discharge path from the transmitter module that is a high-heat-generating element to the refrigerant in the phased array antenna according to the fourth embodiment.

FIG. 8 is a diagram illustrating a heat-discharge path from transmitter modules to the refrigerant in a phased array antenna according to a fourth embodiment of the present invention. In the fourth embodiment, the block 2 illustrated in FIG. 1 is constituted by the thermal sheet 6, the transmitter modules 21, the heat spreaders 22, and a high thermal-conductivity member 31. The front plate 1 is not a structure included in the block 2, and only a portion of the front plate 1 is illustrated in FIG. 8 in order to explain the structure. FIG. 9 is a diagram illustrating a heat-discharge path from a transmitter module, which is a heat-generating element in the phased array antenna according to the fourth embodiment, to a refrigerant. FIG. 9 illustrates a view taken in the direction of an arrow I in FIG. 8. The high thermal-conductivity member 31 makes close contact with a high heat-generating portion 28 of the transmitter module 21 in order to improve the heat-discharging efficiency while maintaining the strength of the heat spreader 22. The high thermal-conductivity member 31 is formed in an L-shape in order to increase the area of contact with the thermal sheet 6 and to perform heat transfer to the refrigerant efficiently. Further, portions of the heat spreader 22 other than the high thermal-conductivity member 31 are formed from aluminum or aluminum alloy, i.e., the main structural material of the heat spreader 22 is aluminum or aluminum alloy.

An end surface of the heat spreader 22 with the transmitter module 21 fixed thereto is in contact with the front plate 1 via the thermal sheet 6. The high thermal-conductivity member 31 is placed in the vicinity of the heat spreader 22 so as to make close contact with a bottom surface of the transmitter module 21. Therefore, in a heat-discharge path 26B, heat generated in the transmitter module 21 is first conducted to the high thermal-conductivity member 31, and then conducted to the front plate 1 via the thermal sheet 6. In the front plate 1, heat is transferred by the refrigerant in the flow paths 15A and 15B.

A metal material such as copper or a material with high thermal conductivity and having thermal anisotropy, such as graphite, can be used as the high thermal-conductivity member 31 locally used to make close contact with the bottom surface of the transmitter module 21 in the heat spreader 22. The material of the high thermal-conductivity member 31 has higher thermal conductivity compared with the main structural material of the heat spreader 22.

In Patent Literature 1, an invention is described in which transmitter modules are mounted such that a plurality of the transmitter modules are mounted on a block and then a plurality of the blocks are attached in an array to a phased array antenna. In this configuration, pipes of the respective blocks are connected to each other by using a member such as a hose to constitute a flow path. In order to increase the cooling performance, a cooling plate is placed near the transmitter module to lower the thermal resistance between the transmitter modules and a refrigerant. In the phased array antenna of Patent Literature 1, it is necessary to use many piping parts, such as a hose and a coupler, in order to connect the pipes of the respective blocks. Therefore, the piping is complicated. When a configuration is employed in which, in order to simplify the piping, each transmitter module is mounted on a heat spreader and each heat spreader is placed in contact with a cooling plate having a flow path of the refrigerant therein, it is necessary that the thermal resistance from the transmitter module to the cooling plate is reduced. However in order to reduce the thermal resistance of the heat spreader, it is necessary to thicken the heat spreader, which makes it difficult to obtain satisfactory cooling performance and to achieve weight reduction simultaneously.

In the phased array antenna according to the fourth embodiment, the heat spreader 22 includes the high thermal-conductivity member 31 that is placed so as to extend from the portion where the transmitter module 21 is mounted to an end surface on the side of the front plate 1. The high thermal-conductivity member 31 is formed from a material with higher thermal conductivity than the other portions of the heat spreader 22. Therefore, heat generated in the transmitter module 21, which is a heat-generating element, can be more easily conducted to the front plate 1 when compared with a heat spreader the whole of which is formed from a main structural material. Therefore, it is possible to achieve weight reduction by making the heat spreader 22 thinner while retaining sufficient cooling performance.

Fifth Embodiment

Figure 10:
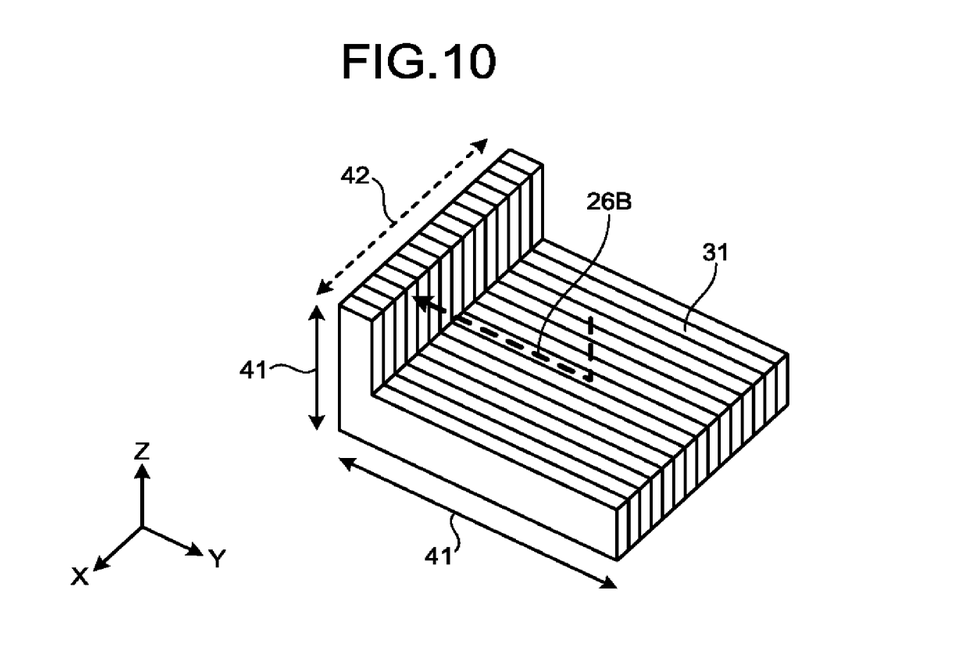
FIG. 10 is a diagram illustrating a structure of a high thermal-conductivity member of a phased array antenna according to a fifth embodiment of the present invention.

FIG. 10 is a diagram illustrating a structure of a high thermal-conductivity member of a phased array antenna according to a fifth embodiment. In the fifth embodiment, the high thermal-conductivity member 31 has one layer of a stacked structure in which graphite members having high thermal conductivity in the same in-plane direction are stacked. The high thermal-conductivity member 31 is a stacked structure of a plurality of sheet-like members each of which has higher thermal conductivity in a plane direction than in a direction normal to the plane. A portion of the member 31 where the transmitter module 21 is mounted and an end thereof on the side of the front plate 1 are connected to each other in the plane direction of the sheet-like members.

In FIG. 10, if it is assumed that the high thermal-conductivity plane of the high thermal-conductivity member 31 is a Y-Z plane, then a Y-direction and a Z-direction are high thermal-conductivity directions 41, and an X-direction is a low thermal-conductivity direction 42. The thermal conductivity of graphite is about 1500 W/mK to 2000 W/mK in the high thermal-conductivity direction 41 and is about 5 W/mK to 10 W/mK in the low thermal-conductivity direction 42.

The heat-discharge path 26B in the phased array antenna according to the fifth embodiment is configured to first conduct heat of the transmitter module 21 to the high thermal-conductivity member 31, and then conduct the heat to the front plate 1 via the thermal sheet 6, as in the fourth embodiment illustrated in FIG. 9. Therefore, in the high thermal-conductivity member 31, the heat is diffused from the transmitter module 21 in the Z-direction first, and is then transferred in the Y-direction, as illustrated in FIG. 10.

By placing the high thermal-conductivity member 31 formed from an anisotropic material with high thermal conductivity, such as graphite, on the contact surface between the heat spreader 22 and the transmitter module 21, the heat conducting performance is improved when compared with the heat spreader 22 that uses only a metal material such as aluminum. By locally placing a material with a high thermal conductivity and with a smaller specific gravity for example graphite, when compared with a metal material in the heat spreader 22, it is possible to achieve weight reduction while the strength of the heat spreader 22 is maintained.

Sixth Embodiment

Figure 11:
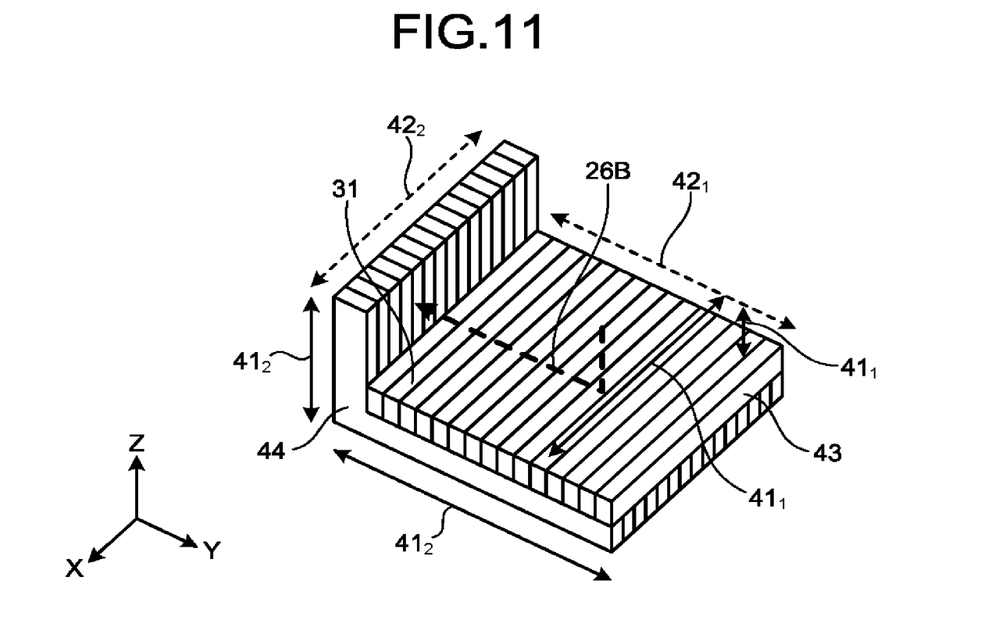
FIG. 11 is a diagram illustrating a structure of a high thermal-conductivity member of a phased array antenna according to a sixth embodiment of the present invention.

FIG. 11 is a diagram illustrating a structure of a high thermal-conductivity member of a phased array antenna according to a sixth embodiment of the present invention. The high thermal-conductivity member 31 of the phased array antenna according to the sixth embodiment has two layers of stacked structures that include materials having high thermal conductivity in different in-plane directions, respectively. A first stacked structure 43, which is a first layer, is configured to have a high thermal-conductivity plane in an X-Z plane. Therefore, the X- and Z-directions are high thermal-conductivity directions $41_1$, and the Y-direction is a low thermal-conductivity direction $42_1$. A second stacked structure 44, which is a second layer, is configured to have a high thermal-conductivity plane in a Y-Z plane. Therefore, the Y- and Z-directions are high thermal-conductivity directions $41_2$, and the X-direction is a low thermal-conductivity direction $42_2$. Accordingly, the high thermal-conductivity member 31 is a stacked structure of a plurality of sheet-like members each of which has higher thermal conductivity in a plane direction than in a direction normal to the plane. It includes the first stacked structure 43 and the second stacked structure 44. In the first stacked structure 43, the plane direction of the sheet-like members extends in a direction perpendicular to a direction connecting, to each other, a portion where the transmitter module 21 is mounted and an end on the side of the front plate 1; and the portion where the transmitter module 21 is mounted is included. In the second stacked structure 44, the plane direction of the sheet-like members extends in a direction parallel to the direction connecting the portion where the transmitter module 21 is mounted and the end on the side of the front plate 1; and the end on the side of the front plate 1 is included.

In order to combine materials with a high thermal conductivity having different stacking directions with each other, a technique of joining the materials to each other with a highly thermally conductive brazing material can be used with graphite. Further, it is possible to join graphite and a metal member such as a copper plate to each other by using the same technique. Placement of the high thermal-conductivity member 31 is identical to that in the fourth embodiment illustrated in FIG. 8.

The heat-discharge path in the sixth embodiment is identical to the heat-discharge path 26B illustrated in FIG. 9, but the flow of heat within the high thermal-conductivity member 31 is different. First, while being diffused in the X-direction inside the first stacked structure 43, heat of the transmitter module 21 is conducted to the second stacked structure 44, as illustrated in FIG. 11. The heat is then diffused in a direction within the Y-Z plane inside an L-shaped block that is the second stacked structure 44, and it is then transferred to a cooling portion. In this manner, as compared with the fourth embodiment, thermal diffusion in the X-direction can be performed more efficiently and it is possible to further reduce the temperature rise in the transmitter module 21.

In the sixth embodiment, a structure in which a difference in the orientation of the heat conducting surface in the first stacked structure 43 and the orientation of the heat conducting surface in the second stacked structure 44 is used in order to efficiently perform thermal diffusion in the X-direction in the stacked structure. Other techniques for efficiently performing thermal diffusion in the X-direction that it is also possible to apply are a technique of applying a metal member such as a copper plate to the first stacked structure 43 and a technique of forming a plating layer such as a copper layer on a surface of the second stacked structure 44.

Seventh Embodiment

Figure 12:
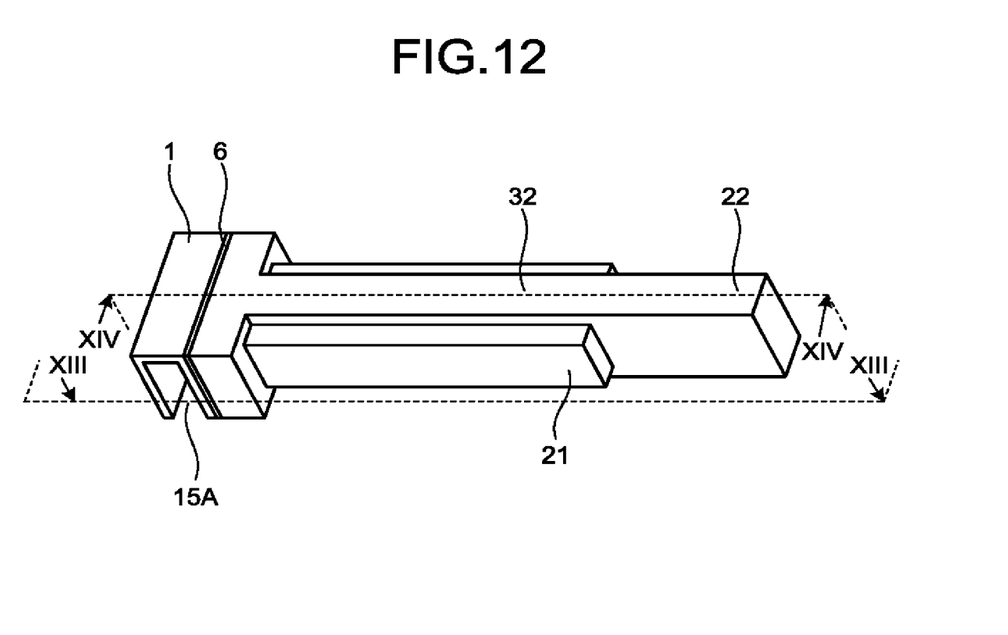
FIG. 12 is a diagram partly illustrating a structure of a heat spreader of a phased array antenna according to a seventh embodiment.
Figure 13:
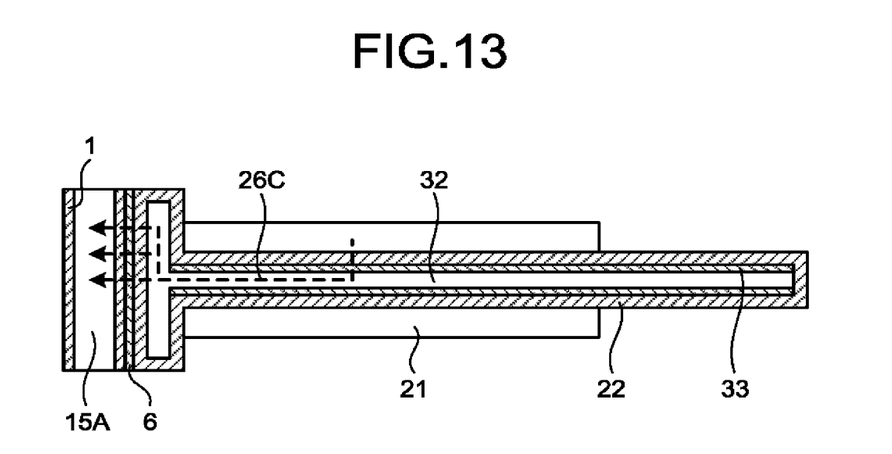
FIG. 13 is a diagram partly illustrating the structure of the heat spreader of the phased array antenna according to the seventh embodiment.
Figure 14:
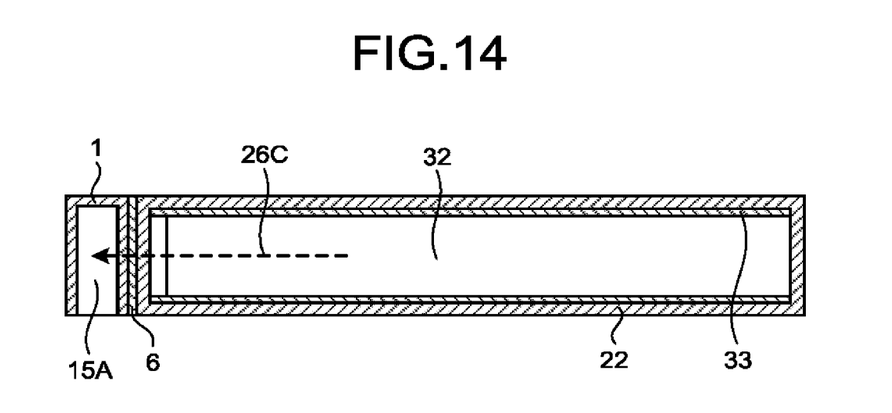
FIG. 14 is a diagram partly illustrating the structure of the heat spreader of the phased array antenna according to the seventh embodiment.

FIG. 12 is a perspective view partly illustrating a structure of a heat spreader of a phased array antenna according to a seventh embodiment. FIG. 13 is a partial cross-sectional view of the heat spreader of the phased array antenna according to the seventh embodiment taken along a line XIII-XIII in FIG. 12. FIG. 14 is a partial cross-sectional view of the heat spreader of the phased array antenna according to the seventh embodiment taken along a line XIV-XIV in FIG. 12. The heat spreader 22 includes a planar heat pipe structure 32. In the seventh embodiment, it is possible not only to apply the heat pipe structure 32 locally in the heat spreader 22 but also to apply the heat pipe structure 32 of any shape entirely in the internal structure, unlike the fourth to sixth embodiments. The heat pipe structure 32 applied in the heat spreader 22 has a wick 33 therein. A refrigerant serving as a working fluid is filled in the wick 33. The wick 33 has a structure that enables the refrigerant to flow back efficiently by capillary action. It is possible for the wick 33 to have a structure in which groove-shaped slits extend radially from a high heat-generating portion to reach a peripheral portion of the front plate 1; to be a mesh structure woven of a material with high thermal conductivity such as a copper line; or to have a structure including sintered metal.

Heat generated in the transmitter module 21 is conducted to the heat pipe structure 32, and the refrigerant in the heat pipe structure 32 is vaporized. The vaporized refrigerant flows to a portion of the heat spreader 22 on the side of the front plate 1 in a heat-discharge path 26C, discharges the heat to the refrigerant flowing in the flow path 15A in the front plate 1 via the thermal sheet 6, and is liquefied. The liquefied refrigerant flows to a portion in the heat spreader 22, which is close to the heat-generating portion of the transmitter module 21, and the cycle described above is repeated. With this method, it is possible to efficiently transfer the heat generated in the transmitter module 21.

Although the heat pipe structure 32 illustrated in FIGS. 12 to 14 is hollow, this shape can be changed to any shape in accordance with required cooling performance and required strength.

In each of the embodiments described above, a case of using a phased array antenna is described. However, the present invention is not limited thereto. The present invention can be applied to an electronic device in which a plurality of cards, to which a coolant is supplied for cooling a mounted electronic component, are mounted therein. The present invention can be also applied to a technique of cooling electronic components, for example, a structure of a housing in which a substrate is mounted. Further, although the refrigerant is an ethylene glycol solution in the above description, the refrigerant can be another type of liquid or gas. In addition, although an example where the material with a high thermal conductivity is graphite has been described, other material with high thermal conductivity can be used.

The configurations described in the above embodiments are only examples of the content of the present invention. The configurations can be combined with other well-known techniques, and a part of each configuration can be omitted or modified without departing from the scope of the present invention.

REFERENCE SIGNS LIST 1 front plate, 2 block, 3 element feeding layer, 4 frame, 5 power-supply wire, 6 thermal sheet, 11, 12 manifold, 13A, 13B, 13C, 13D, 13E, 13F, 13G, 13H left refrigerant inlet/outlet port, 14A, 14B, 14C, 14D, 14E, 14F, 14G, 14H right refrigerant inlet/outlet port, 15A, 15A', 15B, 15B', 15C, 15C', 15D, 15D', 15E, 15F, 15G, 15H flow path, 16 cooling fin, 21 transmitter module, 22 heat spreader, 25 block placement area, 26B, 26C heat-discharge path, 27 high-heat-generating-element placement area, 28 high heat-generating portion, 30 phased array antenna, 31 high thermal-conductivity member, 32 heat pipe structure, 41, $41_1$, $41_2$ high thermal-conductivity direction, 42, $42_1$, $42_2$ low thermal-conductivity direction, 43 first stacked structure, 44 second stacked structure, 52 power-supply-wire fixing surface.

The invention claimed is:

1. A phased array antenna in which a plurality of blocks each having a plurality of transmitter modules are arrayed, the phased array antenna comprising: a front plate comprising a single plate having a front surface and a rear surface including a plurality of flow paths of a refrigerant therein; and an element feeding layer including antenna elements connected to the transmitter modules, respectively, and being placed in close contact with the front surface of the front plate, wherein each of the blocks includes a heat spreader that is placed in close contact with the rear surface of the front plate which is on the other side of the front surface relative to the front plate, the transmitter modules are mounted on the heat spreader, and heat generated in the transmitter modules is transferred to the refrigerant via the heat spreader and the front plate, wherein the heat spreader includes a high thermal-conductivity member that is placed to extend from a portion in which the transmitter modules are mounted to an end surface on a side of the front plate, and the high thermal-conductivity member is formed from a material with higher thermal conductivity than other portions of the heat spreader.

2. The phased array antenna according to claim 1, further comprising:
a power-supply wire to supply power to the blocks; and
a frame placed in close contact with the rear surface of the front plate to separate the blocks from each other, the power-supply wire being placed in close contact with the frame, wherein
heat generated in the power-supply wire is transferred to the refrigerant via the frame and the front plate.

3. The phased array antenna according to claim 1, wherein
the flow paths are folded back in the front plate, and
an inlet port and an outlet port of each of the flow paths are placed adjacent to each other.

4. The phased array antenna according to claim 1, wherein each of the flow paths has a narrower width at a more downstream position.

5. The phased array antenna according to claim 1, wherein the front plate includes a cooling fin in portions of the flow paths in which the blocks are placed in close contact with the front plate.

6. A phased array antenna in which a plurality of blocks each having a plurality of transmitter modules are arrayed, the phased array antenna comprising:
a front plate including a plurality of flow paths of a refrigerant therein, and
an element feeding layer including antenna elements connected to the transmitter modules, respectively, and being placed in close contact with one surface of the front plate, wherein
each of the blocks includes a heat spreader that is placed in close contact with another surface of the front plate which is on the other side of the one surface relative to the front plate,
the transmitter modules are mounted on the heat spreader, and
heat generated in the transmitter modules is transferred to the refrigerant via the heat spreader and the front plate, wherein
the heat spreader includes a high thermal-conductivity member that is placed to extend from a portion in which the transmitter modules are mounted to an end surface on a side of the front plate, and
the high thermal-conductivity member is formed from a material with higher thermal conductivity than other portions of the heat spreader.

7. The phased array antenna according to claim 6, wherein
the high thermal-conductivity member has a stacked structure of a plurality of sheet-like members, each of which has higher thermal conductivity in a plane direction than in a direction normal to the plane, and
the portion in which the transmitter modules are mounted and the end surface on a side of the front plate are connected to each other in the plane direction of the sheet-like members.

8. The phased array antenna according to claim 6, wherein
the high thermal-conductivity member has a stacked structure of a plurality of sheet-like members, each of which has higher thermal conductivity in a plane direction than in a direction normal to the plane, and
the stacked structure includes
a first stacked structure in which the plane direction of the sheet-like members extends in a direction perpendicular to a direction that connects, to each other, the portion in which the transmitter modules are mounted and the end surface on a side of the front plate, the first stacked structure including the portion in which the transmitter modules are mounted, and a second stacked structure in which the plane direction extends in a direction parallel to the direction that connects the portion in which the transmitter modules are mounted and an end of the front plate, the second stacked structure including the end surface on the side of the front plate.

9. The phased array antenna according to claim 1, wherein the heat spreader has a heat pipe structure.

* * * * *